(12) United States Patent
Shiina

(10) Patent No.: US 6,967,406 B2
(45) Date of Patent: Nov. 22, 2005

(54) SEMICONDUCTOR INTEGRATED CIRCUIT

(75) Inventor: Masahiro Shiina, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 238 days.

(21) Appl. No.: 10/278,030

(22) Filed: Oct. 23, 2002

(65) Prior Publication Data
US 2003/0075736 A1 Apr. 24, 2003

(30) Foreign Application Priority Data

Oct. 24, 2001 (JP) ........................................ 2001-326367
Jan. 23, 2002 (JP) ........................................ 2002-014086

(51) Int. Cl.[7] .............................................. H01L 23/48
(52) U.S. Cl. ..................... 257/758; 257/210; 257/525; 257/526; 257/539; 257/552; 257/565
(58) Field of Search ............................... 257/758–760, 257/210, 511–518, 525–526, 539–543, 552–563, 565–593

(56) References Cited

U.S. PATENT DOCUMENTS

| | | | | |
|---|---|---|---|---|
| 4,871,976 A | * | 10/1989 | Watanabe et al. | 330/69 |
| 5,517,061 A | * | 5/1996 | Azmanov | 257/758 |
| 5,896,051 A | * | 4/1999 | Umeda et al. | 327/77 |
| 5,923,059 A | * | 7/1999 | Gheewala | 257/204 |
| 6,559,718 B2 | * | 5/2003 | Kudo et al. | 330/252 |

FOREIGN PATENT DOCUMENTS

| | | | |
|---|---|---|---|
| JP | 05075438 A | * | 3/1993 |
| KR | 1997-0003938 | | 1/1997 |
| KR | 2001-0020833 | | 3/2001 |

OTHER PUBLICATIONS

Weste et al. "Principles of CMOS VLSI Design", 1985, pp. 349–351.

* cited by examiner

Primary Examiner—David Nelms
Assistant Examiner—Andy Huynh
(74) Attorney, Agent, or Firm—Morrison & Foerster LLP

(57) ABSTRACT

A layout method of a semiconductor integrated circuit is provided which improves characteristics of the circuit by giving hierarchical structure of interconnections regularity. A pair of emitter followers is disposed symmetrically with respect to a center line of a differential amplifier. Thus, interconnections within a circuit block and a ground wiring can be made with a single metal layer, since an area where the interconnections cross with each other is eliminated. Herewith cross talk due to the intersection of the interconnections can be resolved. Also, the interconnections between the differential amplifier and the emitter follower circuits can be made equal in length. It is possible to assign a second metal layer to interconnections between circuit blocks and a third metal layer to a power supply so that characteristics of the semiconductor integrated circuit are improved.

7 Claims, 6 Drawing Sheets

SEMICONDUCTOR INTEGRATED CIRCUIT

BACKGROUND OF THE INVENTION

1. Field of the Invention

This invention relates to a semiconductor integrated circuit, specifically to a technology for structuring a circuit to improve characteristics of the circuit by giving regularity to a hierarchical structure of interconnections in a hierarchical design having multi-layer interconnections.

2. Description of the Related Art

A prior art semiconductor integrated circuit structure will be explained referring to FIGS. 6A and 6B hereinafter. The explanation will be given by taking a differential amplifier, which is frequently used in bipolar linear integrated circuits, as an example.

In the basic structure of the differential amplifier 11, both emitters of a first transistor Q11 and a second transistor Q12 are connected to a constant current transistor Q13, and each of the collectors of the transistors Q11 and Q12 is connected to a power supply Vcc through load resistors R11 and R12, respectively, as shown in FIG. 6A.

Compensating variable factors of the transistors to suppress their effects on an output is made possible by increasing the difference between signals Vin1 and Vin2, which are respectively applied to bases of the transistors Q11 and Q12, the bases serving as input terminals, and creating output signals Vout1 and Vout2 from collectors of the transistors Q11 and Q12, respectively.

Attention is paid to secure pair matching of the transistors Q11 and Q12 as well as pair matching of the load resistors R1 and R12, since a midpoint potential of the output would shift, resulting in a loss of desired circuit characteristics, if balance between elements is lost. Here, pair matching means uniformity in the characteristics of the elements forming the pair.

However, even though attention is paid to secure the pair matching of the transistors Q11 and Q12 as well as pair matching of the load resistors R11 and R12 in the above mentioned circuit, there are problems, which are described below, when the circuit is laid out to dispose each of the semiconductor elements according to a circuit diagram, for instance from left to right (or from right to left).

That is, each of the emitter follower circuits 42 and 43 connected to each of the pair of the differential outputs of the differential amplifier 11 is disposed to one side (right side) of a center line of the differential amplifier 11, as shown in FIG. 6A. The emitter follower circuit 42 includes a transistor Q14, a constant current transistor Q16 and an emitter resistor R13 of the constant current transistor Q16. The emitter follower circuit 43 includes a transistor Q15, a constant current transistor Q17 and an emitter resistor R14 of the constant current transistor Q17.

Therefore, pair matching of the semiconductor integrated circuit which includes the differential amplifier 11 could be lost, and an impedance offset could arise when the circuit blocks are interconnected, resulting in deterioration in the circuit characteristics.

Furthermore, interconnections 12 and 14 need to be formed with a layer which is different from the layer used for interconnections 13 and 15 (the interconnections 13 and 15 are formed with the first layer interconnection while the interconnections 12 and 14 are formed with the second layer interconnection in the above configuration), since the interconnection 12, inputting the output from the collector of the transistor Q11 to a base of the transistor Q14 of the emitter follower circuit 42, intersects with the interconnection 13 connecting the resistor R12 and the collector of the transistor Q12. Similarly, the interconnection 14, inputting the output from the collector of the transistor Q12 to a base of the transistor Q15 of the emitter follower circuit 43 intersects with the interconnection 15 connecting the emitter of the transistor Q14 and the collector of the transistor Q16 of the emitter follower 42, as shown in FIG. 6B, because both the emitter followers 42 and 43 connected with the outputs of the differential amplifier 11 are disposed to one side (right side) of a center of the differential amplifier 11 as described above. High frequency characteristics are deteriorated due to signal cross talk when the interconnections intersect with each other. In addition, pair matching is lost because the length of the interconnection 12 differs from that of the interconnection 14. Therefore, when the circuit blocks are interconnected, desired characteristics might not be obtained because of the offset due to the impedance.

In the integrated circuit of the prior art, because rules (purpose of usage and pair matching) have not been established for each layer of the interconnections, each of interconnections are formed with a different layer taking the easy way out when the intersection of the interconnections is expected, thus causing deterioration in the circuit characteristics.

Furthermore, for design automation of a semiconductor integrated circuit with a hierarchical structure, for example, when interconnecting within each circuit block as well as between the circuit blocks, a layout method of the semiconductor integrated circuit such as using the first layer metal for horizontal interconnection and using the second layer metal for vertical interconnection has been proposed.

However, when the interconnection is made based on the criteria mentioned above (such as using the first layer metal for horizontal interconnection and using the second layer metal for vertical interconnection), a plurality of interconnection layers is used even where a single layer of interconnection could make the interconnection, making the interconnection too complicated.

SUMMARY OF THE INVENTION

This invention is directed to solve the problems addressed above, by assigning each of a plurality of interconnection layers to each of interconnection purposes in designing an integrated circuit having a circuit block with a plurality of semiconductor elements and multi-layer interconnections at least to connect the semiconductor elements. Complicating the multi-layer interconnection can be avoided with the invention, leading to improved circuit characteristics.

DETAILED DESCRIPTION OF THE INVENTION

An embodiment of a semiconductor integrated circuit of this invention will be explained referring to the figures.

The explanation will be given by taking a differential amplifier, which is frequently used in bipolar linear integrated circuit, as an example.

Figure 1:
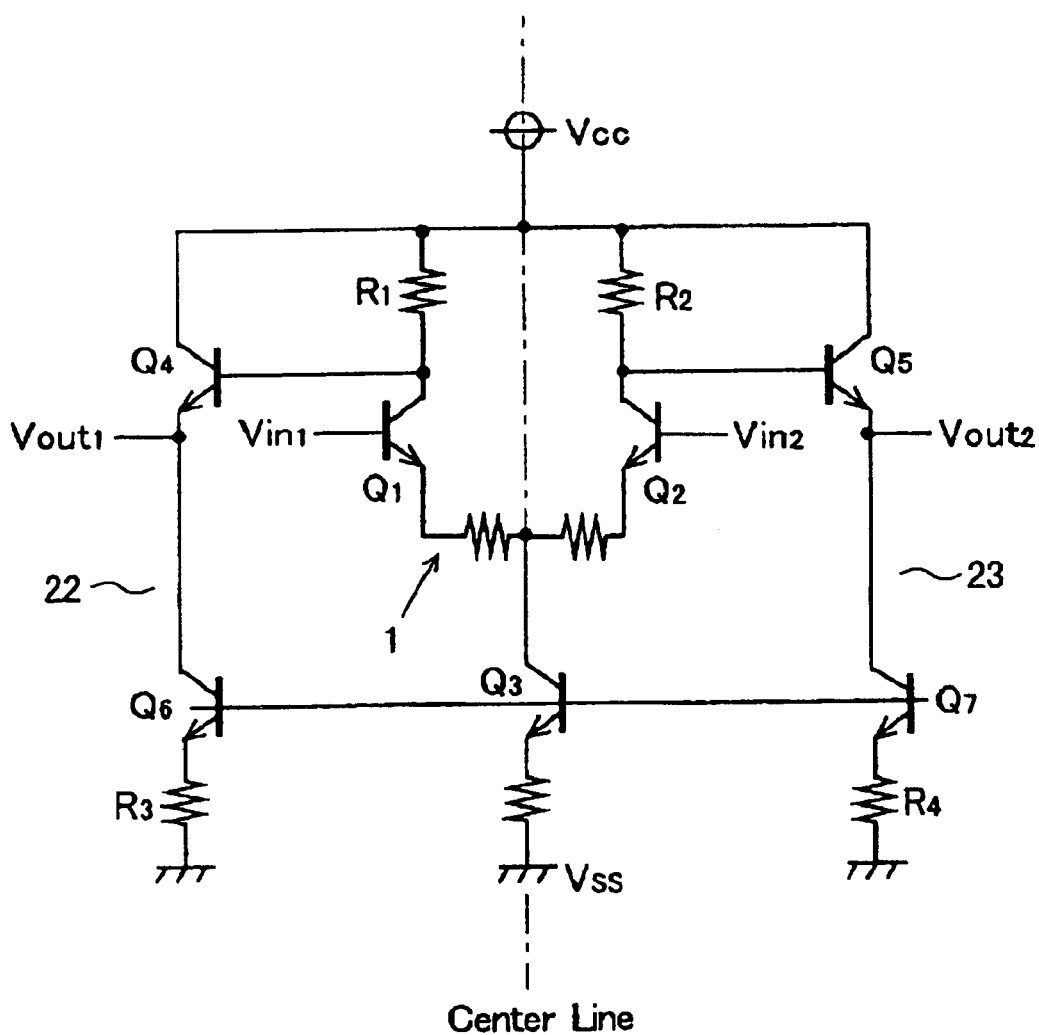
FIG. 1 shows a circuit diagram of a semiconductor integrated circuit according to a first embodiment of the invention.
Figure 2:
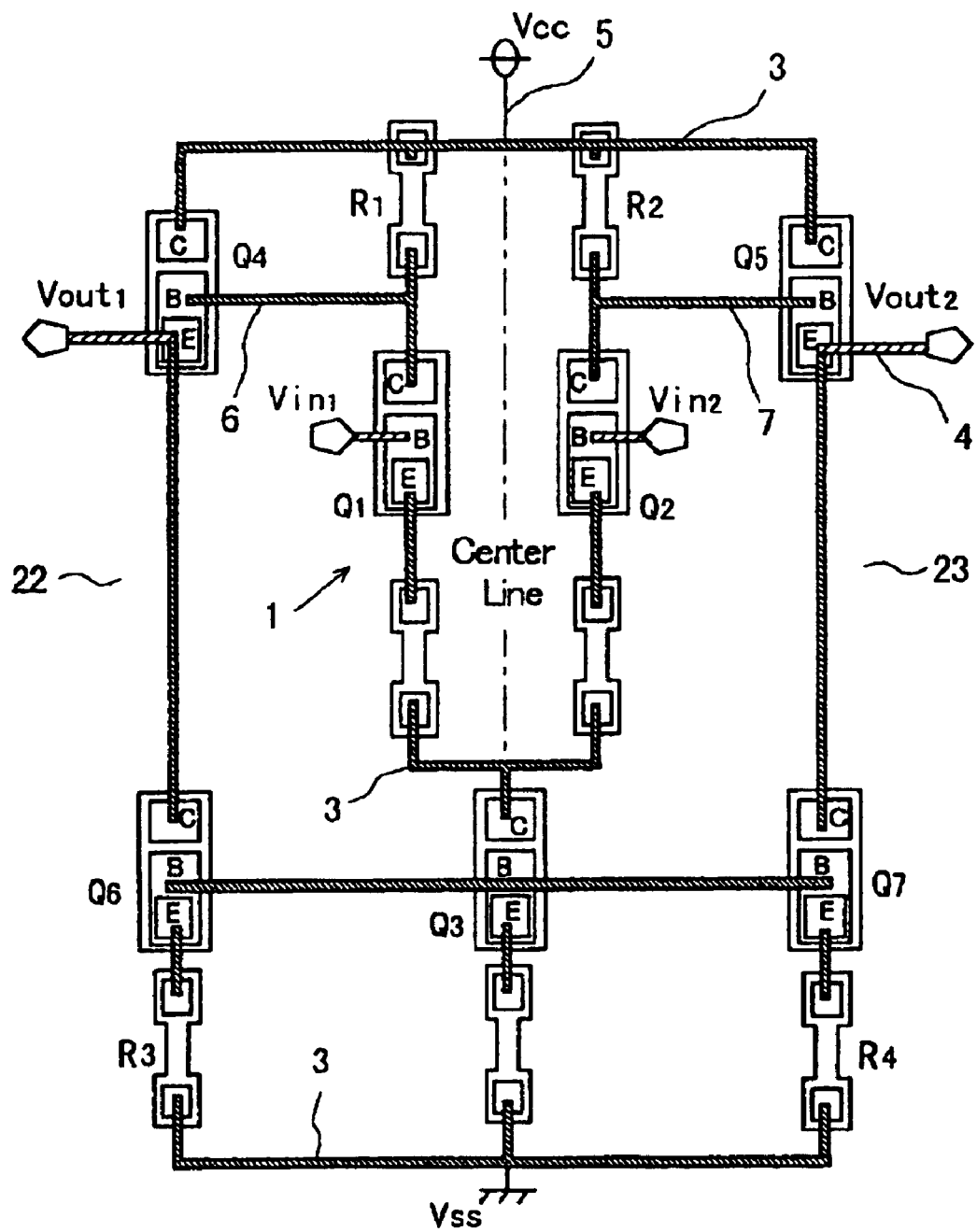
FIG. 2 shows a layout of the semiconductor integrated circuit according to the first embodiment of the invention.

As shown in FIG. 1, each of a pair of emitter follower circuits 22 and 23 is connected respectively to each of a pair of differential output terminals of a circuit block 1 (a differential amplifier in this embodiment) composed of bipolar transistors. The emitter follower circuits 22 and 23 are disposed symmetrically with respect to a center line of the circuit block 1.

Figure 6A:
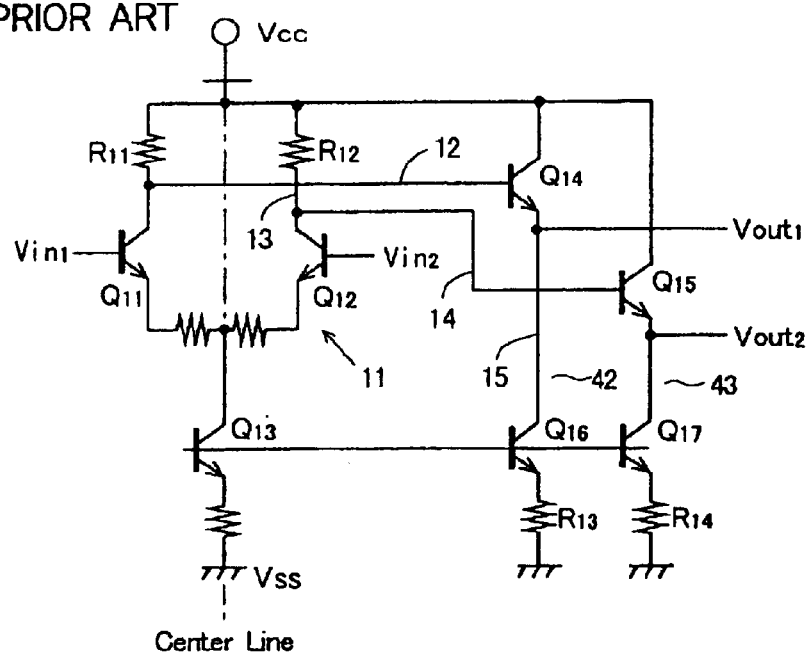
FIG. 6A shows a circuit diagram of a semiconductor integrated circuit according to the prior art.
Figure 6B:
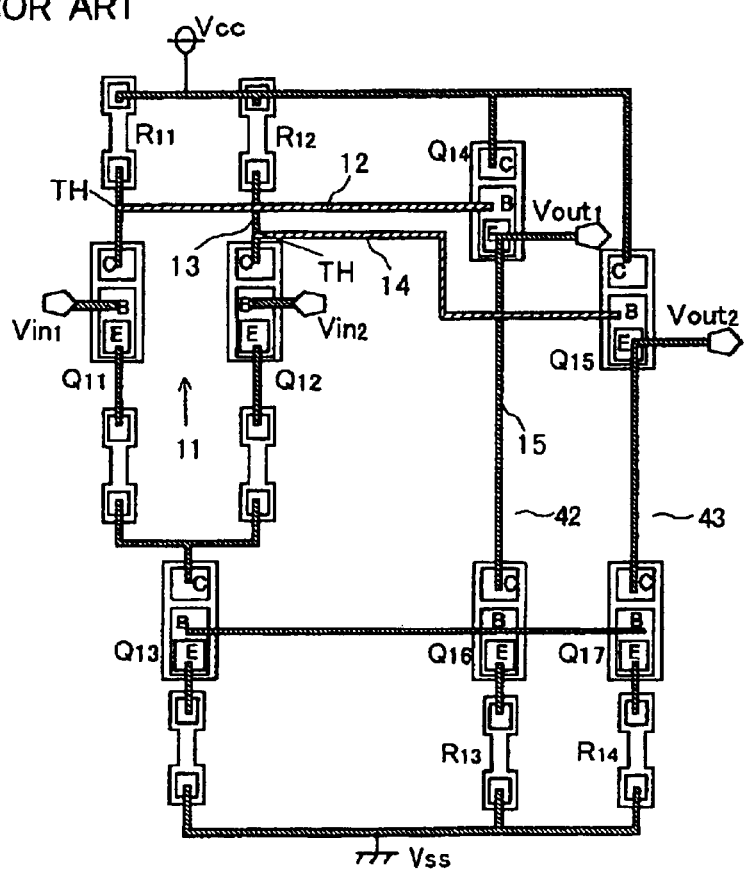
FIG. 6B shows a layout of the semiconductor integrated circuit according to the prior art.

Circuit pair matching is improved herewith compared to the conventional circuit shown in FIG. 6B, in which the emitter follower circuits 42 and 43 connected with a pair of the outputs of the differential amplifier 11 are disposed asymmetrically with respect to the center line of the differential amplifier 11. Therefore, the characteristics of a semiconductor integrated circuit can be improved, when the invention is applied to a circuit such as the differential amplifier that prefers pair matching. The invention can be applied to a circuit other than the differential amplifier such as a filter. It can be applied to a semiconductor integrated circuit in which each of a pair of emitter follower circuits is connected to each of a pair of outputs of the circuit, respectively.

In the differential amplifier 1, both emitters of a first transistor Q1 and a second transistor Q2 are connected to a constant current transistor Q3, and each of collectors of the transistors Q1 and Q2 is connected to a power supply Vcc through load resisters R1 and R2, respectively, as shown in FIG. 1.

Compensating variable factors of the transistors to suppress their effects is made possible by amplifying the difference between signals Vin1 and Vin2 applied to bases of the transistors Q1 and Q2, which are input terminals, and getting output signals Vout1 and Vout2 from the collectors of the transistors Q1 and Q2.

The emitter follower circuits 22 and 23 are connected to outputs of the differential amplifier 1 and are disposed symmetrically with respect to the center line of the differential amplifier 1. Here, the emitter follower circuit 22 includes a transistor Q4, a base of which is connected to the collector of the transistor Q1, a constant current transistor Q6, which provides the transistor Q4 with constant current and an emitter resistor R3 of the constant current transistor Q6. Similarly, the emitter follower circuit 23 includes a transistor Q5, a base of which is connected to the collector of the transistor Q2, a constant current transistor Q7, which provides the transistor Q5 with constant current and an emitter resistor R4 of the constant current transistor Q7.

According to this embodiment, a pair of the emitter followers 22 and 23 is disposed symmetrically with respect to the center line of the differential amplifier 1. Thus, interconnections within a circuit block and a ground wiring can be made with a first metal layer 3, since the area in which the interconnections cross is eliminated. Herewith cross talk due to the intersection of the interconnections can be resolved. Also, the interconnections 6 and 7 between the differential amplifier and the emitter follower circuits can be made equal in length. It is possible to assign a second metal layer 4 to interconnection between the circuit blocks and a third metal layer 5 to the power supply Vcc. Characteristics of the semiconductor integrated circuit with hierarchical structure can be improved with this layout method.

Next, a second embodiment of this invention will be explained referring to the figures hereinafter.

In the second embodiment, the invention is applied to a double differential amplifier or so-called Gilbert cell.

Figure 3:
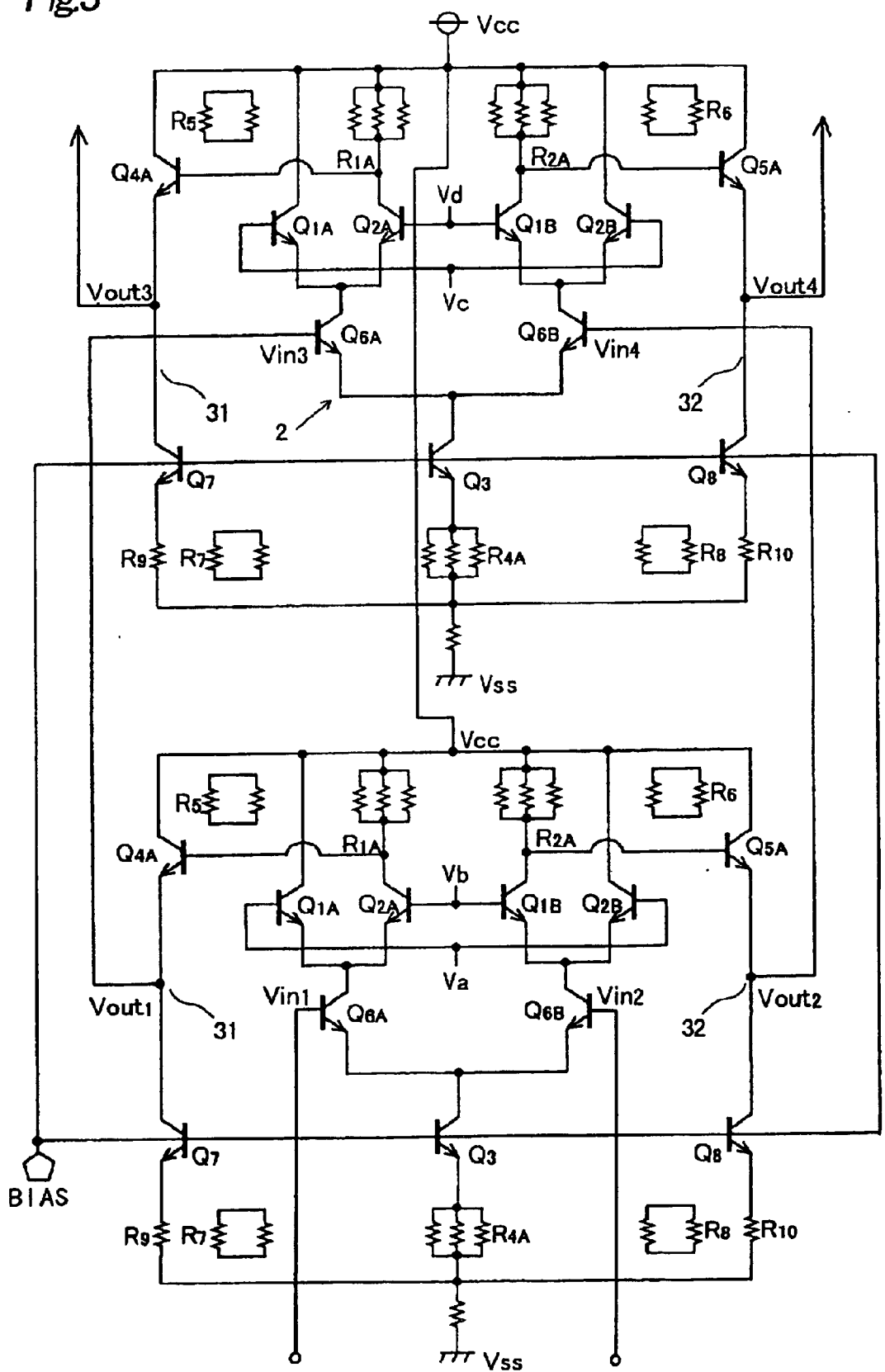
FIG. 3 shows a circuit diagram of a semiconductor integrated circuit according to a second embodiment of the invention.
Figure 4:
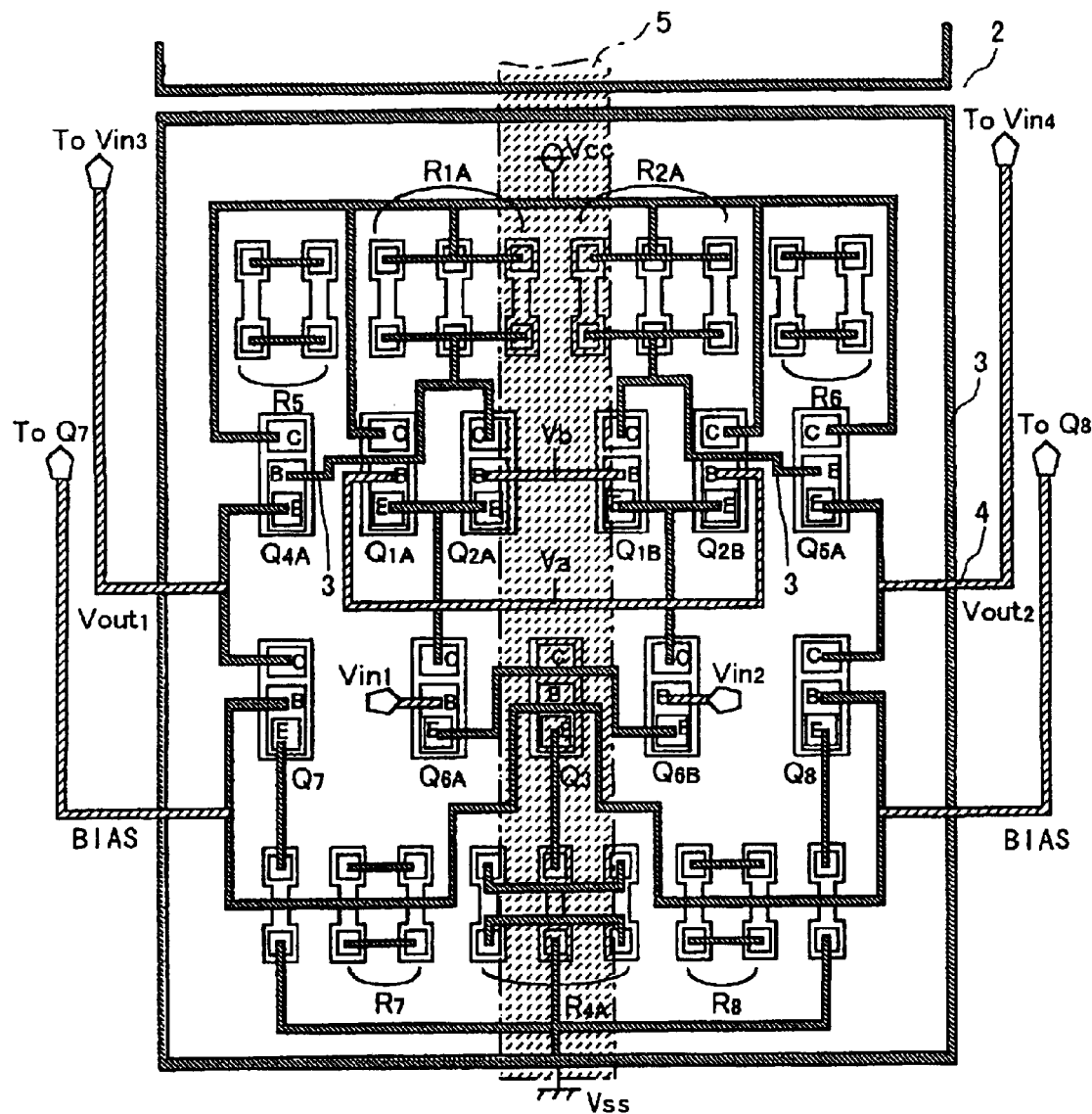
FIG. 4 shows a layout of the semiconductor integrated circuit according to the second embodiment of the invention.

FIG. 3 and FIG. 4 are a circuit diagram and a layout of a two-stage double differential amplifier 2, respectively, according to this embodiment. As shown in FIG. 3, output signals (Vout1 and Vout2) of a first stage double differential amplifier 2 provide inputs (Vin3 applied to a base of an input transistor Q6A and Vin4 applied to a base of an input transistor Q6B) to a second stage double differential amplifier 2. This arrangement forms a sequentially connected two-stage double differential amplifier, which provides output signals Vout3 and Vout4 from the second stage double differential amplifier 2. The same symbol is attached to an equivalent component in the other stage to avoid duplicate explanations.

As shown in FIG. 3, both emitters of a first transistor Q1A and a second transistor Q2A are connected to a collector of an input transistor Q6A, both emitters of a third transistor Q1B and a fourth transistor Q2B are connected to a collector of an input transistor Q6B, both emitters of the input transistors Q6A and Q6B are connected to a constant current transistor Q3 and each of collectors of the transistors Q2A and Q1B is connected to the power supply Vcc through load resistors R1A and R2A, respectively, forming a basic structure. Each of the collectors of the transistors Q1A, Q2A, Q1B and Q2B can be connected to the power supply Vcc through a load resistor instead.

Compensating variable factors of the transistors to suppress their effects is made possible by amplifying the difference between signals applied to bases of the transistors Q6A and Q6B, which are input signals Vin1 and Vin2, respectively, and obtaining the output signals Vout1 and Vout2 from the collectors of the transistors Q2A and Q1B through transistors Q4A and Q5A, respectively.

In the semiconductor integrated circuit of this embodiment, a pair of emitter follower circuits 31 and 32, each connected to each of a pair of outputs of the differential amplifier 2, respectively, is disposed symmetrically with respect to a center line (not shown) of the double differential amplifier 2. Here, the emitter follower circuit 31 includes the transistor Q4A, a base of which is connected to the collector of the transistor Q2A, a constant current transistor Q7, which provides the transistor Q4A with constant current, and an emitter resistor R9 of the constant current transistor Q7. Similarly, the emitter follower circuit 32 includes the transistor Q5A, a base of which is connected to the collector of the transistor Q1B, a constant current transistor Q8, which provides the transistor Q5A with constant current, and an emitter resistor R10 of the constant current transistor Q8.

When the invention is applied to a circuit such as the double differential amplifier 2 which prefers pair matching, the characteristics of the circuit can be improved, since the pair matching of the circuit is improved by disposing each pair of emitter follower circuits 31 and 32, connected to each of a plurality of the output stages, symmetrically with respect to the center line of the double differential amplifier 2.

Resistors R5, R6, R7 and R8, which are for trimming, are also disposed symmetrically with respect to the center line of the differential amplifier 2. When these resistors are used, the pair matching and thus the characteristics of the circuit can be maintained.

With this invention as described above, a pair of emitter follower circuits 31 and 32 is disposed symmetrically with respect to the center line of the double differential amplifier 2. Thus interconnection within each circuit block can be made using a first metal layer 3, as shown in FIG. 4. It is possible to assign a second metal layer 4 to the interconnection between the circuit blocks and a third metal layer 5 to the power supply Vcc. Characteristics of the semiconductor integrated circuit with hierarchical structure can be improved with the layout method.

Unlike in the prior art shown in FIG. 6B, where the upper layer interconnections 12 and 14 are formed above the lower layer interconnections 13 and 15 to avoid intersecting with each other and the interconnections 12 and 14 differ in length, the circuit blocks are disposed symmetrically and the interconnections are made with a single layer (first metal layer 3) in both the first and the second embodiments, leading to improved characteristics of the semiconductor integrated circuits.

However, this invention is not limited to the single-layer interconnection mentioned above, but also applicable to a structure where both an upper-layer interconnection and a lower-layer interconnection are used effectively as described below. A layout of a Gilbert cell shown in FIG. 5 differs from the layout of the Gilbert cell shown in FIG. 4 in that the second metal layer is used for interconnections 4a and 4b, connecting each of the collectors of the transistors Q2A and Q1B with each of the bases of the transistors Q4A and Q5B, respectively.

Figure 5:
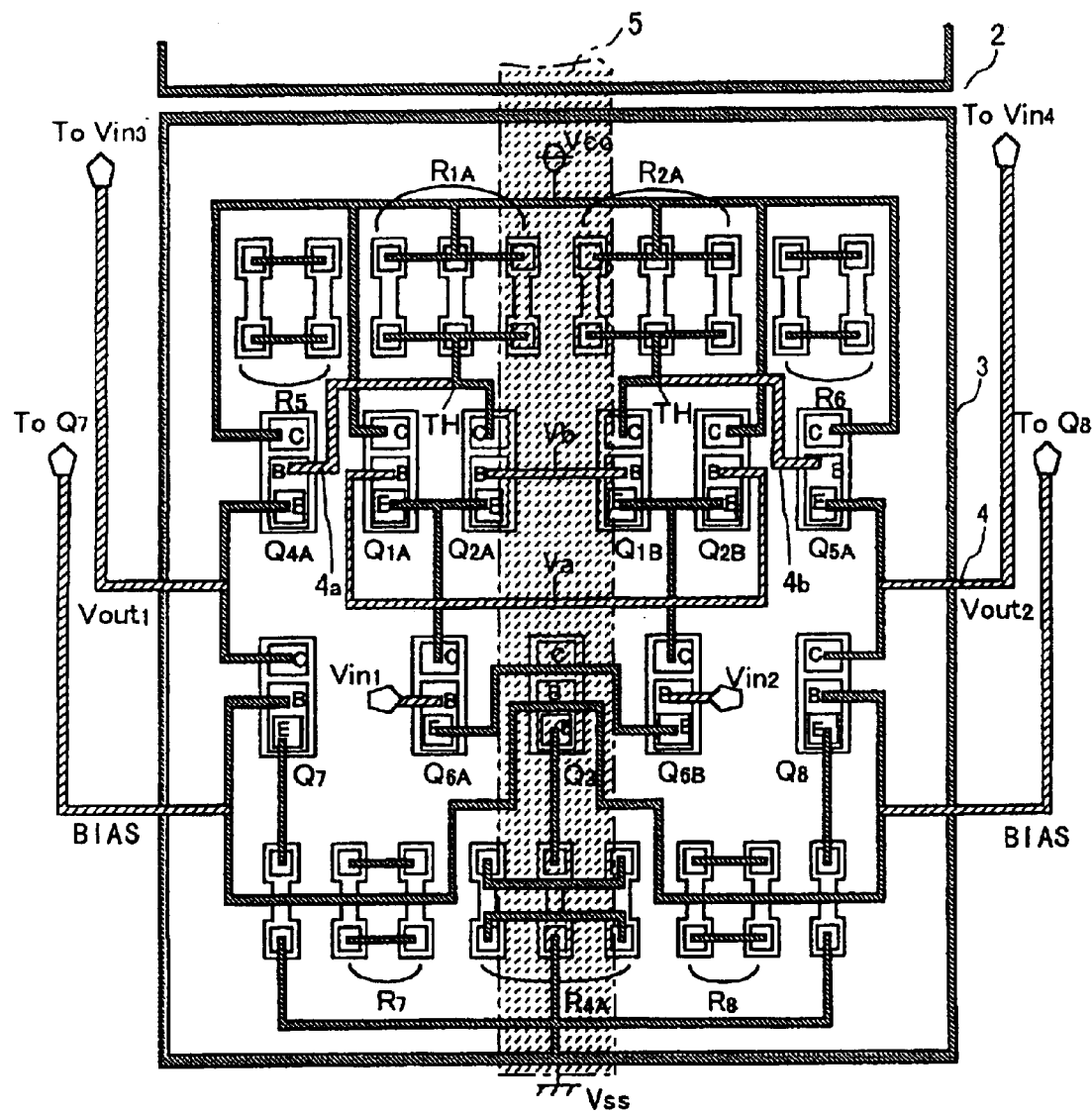
FIG. 5 shows a layout of a semiconductor integrated circuit according to a third embodiment of the invention.

Although the second metal layer interconnections 4a and 4b are used in the portion mentioned above (between the collectors of the transistors Q2A and Q1B and the bases of the transistors Q4A and Q5B) as shown in FIG. 5, the offset, which exists in the prior art due to the impedance difference between the interconnections, is suppressed resulting in the improved characteristics of the semiconductor integrated circuit, since the interconnections 4a and 4b which contact the lower layer interconnection (the first metal layer 3 in this embodiment) are disposed symmetrically and are equal in length.

Other embodiments of this invention include semiconductor devices which incorporate an active element such as a bipolar or MOS element, semiconductor devices having a Gilbert-cell structure and requiring symmetry, such as a mixer or an AGC circuit, semiconductor devices used in a high frequency region, semiconductor devices using a SiGe process and semiconductor devices for satellite TV, terrestrial TV and an RF LAN.

With the invention, offset due to impedance can be suppressed to improve the characteristics of a semiconductor integrated circuit by forming the integrated circuit so that each layer of interconnections has regularity (purpose, pair matching, etc.), when interconnecting conventional circuit blocks.

Because the power supply line includes a top-layer interconnection wider than other interconnections, the impedance can be reduced to realize a semiconductor integrated circuit with higher precision.

What is claimed is:

1. A semiconductor integrated circuit, comprising:

a plurality of circuit blocks each comprising a plurality of semiconductor elements; and a multi-layer interconnection comprising at least three connection layers, wherein a first layer of the multi-layer interconnection is configured to provide ground connection and interconnection within each of the circuit blocks, a second layer of the multi-layer interconnection is configured to provide interconnection between the circuit blocks, and a third layer of the multi-layer interconnection is configured to provide power supply connection.

2. The semiconductor integrated circuit of claim 1, wherein the plurality of semiconductor elements of one of the circuit blocks is disposed symmetrically with respect to a center line of a corresponding circuit block.

3. The semiconductor integrated circuit of claim 1, wherein the semiconductor elements of one of the circuit blocks include a pair of differential transistors and a pair of emitter follower circuits to which amplified differential outputs of the differential transistors are provided through a pair of interconnections, and the pair of differential transistors, the pair of interconnections and the pair of emitter follower circuits are disposed symmetrically with respect to a center line of a corresponding circuit block.

4. The semiconductor integrated circuit of claim 3, wherein the pair of differential transistors and the pair of emitter follower circuits include bipolar transistors.

5. A semiconductor integrated circuit, comprising:

a circuit block comprising a first differential transistor, a second differential transistor, a first emitter follower circuit and a second emitter follower circuit;

a first connection layer comprising a first wiring connection and a second wiring connection, the first wiring connection connecting the first differential transistor and the first emitter follower circuit and the second wiring connection connecting the second differential transistor and the second emitter follower circuit; and a second connection layer dedicated for providing power supply connection, wherein no wiring connection other than the power supply conection layer intersects the first wiring connection of the second wiring connection.

6. The semiconductor integrated circuit of claim 5, wherein the first differential transistor, the first emitter follower circuit and the first wiring connection are disposed on one side with respect to a line intersecting the semiconductor integrated circuit, and the second differential transistor, the second emitter follower circuit and the second wiring connection are disposed on another side with respect to the line intersecting the semiconductor integrated circuit.

7. The semiconductor integrated circuit of claim 6, wherein the first and second differential transistors, the first and second emitter follower circuits and the first and second wiring connections are disposed symmetrically with respect to the line intersecting the semiconductor integrated circuit.

* * * * *